United States Patent
Chien et al.

(10) Patent No.: US 10,162,277 B2
(45) Date of Patent: Dec. 25, 2018

(54) EXTREME ULTRAVIOLET LITHOGRAPHY SYSTEM WITH DEBRIS TRAPPER ON EXHAUST LINE

(71) Applicant: Taiwan Semiconductor Manufacturing Co., Ltd., Hsinchu (TW)

(72) Inventors: Shang-Chieh Chien, New Taipei (TW); Jye-Fu Jeng, Hsinchu (TW); Shih-Chang Shih, Hsinchu (TW); Kun-Jin Wu, Hsinchu (TW); Guan-Heng Liu, Hsinchu (TW); Jen-Yang Chung, Hsinchu (TW); Li-Jui Chen, Hsinchu (TW); Po-Chung Cheng, Chiayi County (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/800,215

(22) Filed: Nov. 1, 2017

(65) Prior Publication Data

US 2018/0173117 A1    Jun. 21, 2018

Related U.S. Application Data

(60) Provisional application No. 62/435,010, filed on Dec. 15, 2016.

(51) Int. Cl.
*G03F 7/20* (2006.01)
*H05G 2/00* (2006.01)

(52) U.S. Cl.
CPC ...... *G03F 7/70916* (2013.01); *G03F 7/70033* (2013.01); *G03F 7/70175* (2013.01); *G03F 7/70908* (2013.01); *G03F 7/70933* (2013.01); *H05G 2/00* (2013.01); *H05G 2/001* (2013.01); *H05G 2/005* (2013.01); *H05G 2/008* (2013.01)

(58) Field of Classification Search
CPC ............ G03F 7/70033; G03F 7/70916; G03F 7/70933
See application file for complete search history.

(56) References Cited

U.S. PATENT DOCUMENTS

| | | | |
|---|---|---|---|
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 4/2015 | Huang et al. |
| 9,184,054 | B1 | 11/2015 | Huang et al. |
| 9,256,123 | B2 | 2/2016 | Shih et al. |
| 9,377,693 | B2 | 6/2016 | Huang et al. |
| 9,529,268 | B2 | 12/2016 | Chang et al. |
| 9,548,303 | B2 | 1/2017 | Lee et al. |
| 9,625,824 | B2 | 4/2017 | Lu et al. |
| 2006/0012761 | A1* | 1/2006 | Bakker ............... G03F 7/70908 355/30 |

* cited by examiner

*Primary Examiner* — Michelle M Iacoletti
(74) *Attorney, Agent, or Firm* — Haynes and Boone, LLP

(57) ABSTRACT

An extreme ultraviolet (EUV) lithography system includes a collector designed to collect and reflect EUV radiation, a cover integrated with the collector, a first exhaust line connected to the cover and configured to receive debris vapor from the collector, a debris trapper connected to the first exhaust line and configured to trap the debris vapor, and a second exhaust line connected to the debris trapper.

20 Claims, 8 Drawing Sheets

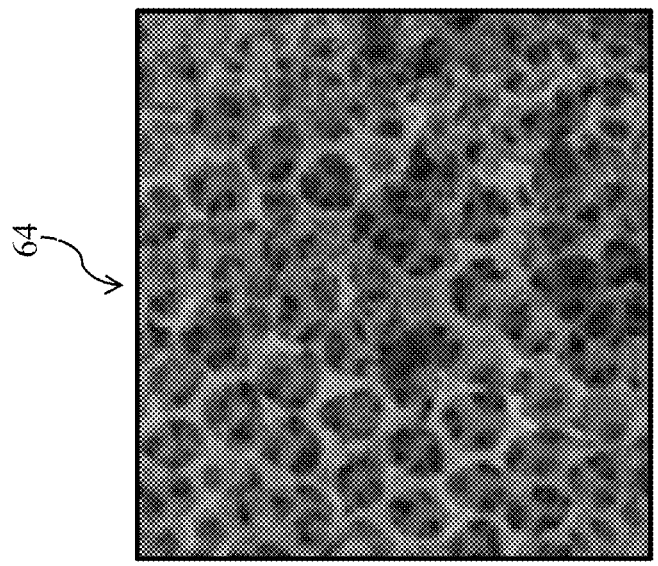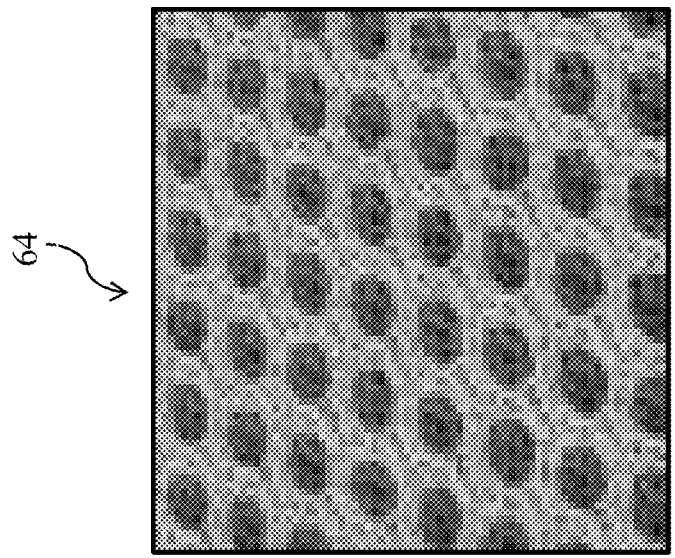
Fig. 3D

EXTREME ULTRAVIOLET LITHOGRAPHY SYSTEM WITH DEBRIS TRAPPER ON EXHAUST LINE

PRIORITY DATA

This application claims the benefits of U.S. Prov. App. No. 62/435,010 entitled "Extreme Ultraviolet Lithography System with Debris Trapper on Exhaust Line," filed Dec. 15, 2016, herein incorporated by reference in its entirety.

BACKGROUND

Extreme ultraviolet lithography (EUVL) has been developed to perform high resolution photolithography in semiconductor manufacturing. The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. One type of EUV light source is laser-produced plasma (LPP). One LPP technology produces EUV light by focusing a high-power laser beam onto small tin droplets to form highly ionized plasma that emits EUV radiation with a peak of maximum emission at 13.5 nm. The EUV light is then collected by a LPP collector and reflected by optics towards a lithography target, e.g., a wafer. The LPP collector is subjected to damages and degradations due to the impact of particles, ions, radiation, and most seriously, tin deposition. One pressing issue in the current EUVL is how to reduce tin deposition on the surface of the LPP collector so that the usable lifetime of the LPP collector can be extended.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3B, 3C, and 3D illustrate some debris trapping structures that may be employed by a debris trapper of FIG. 3A, in accordance with some embodiments.

DETAILED DESCRIPTION

Figure 1:
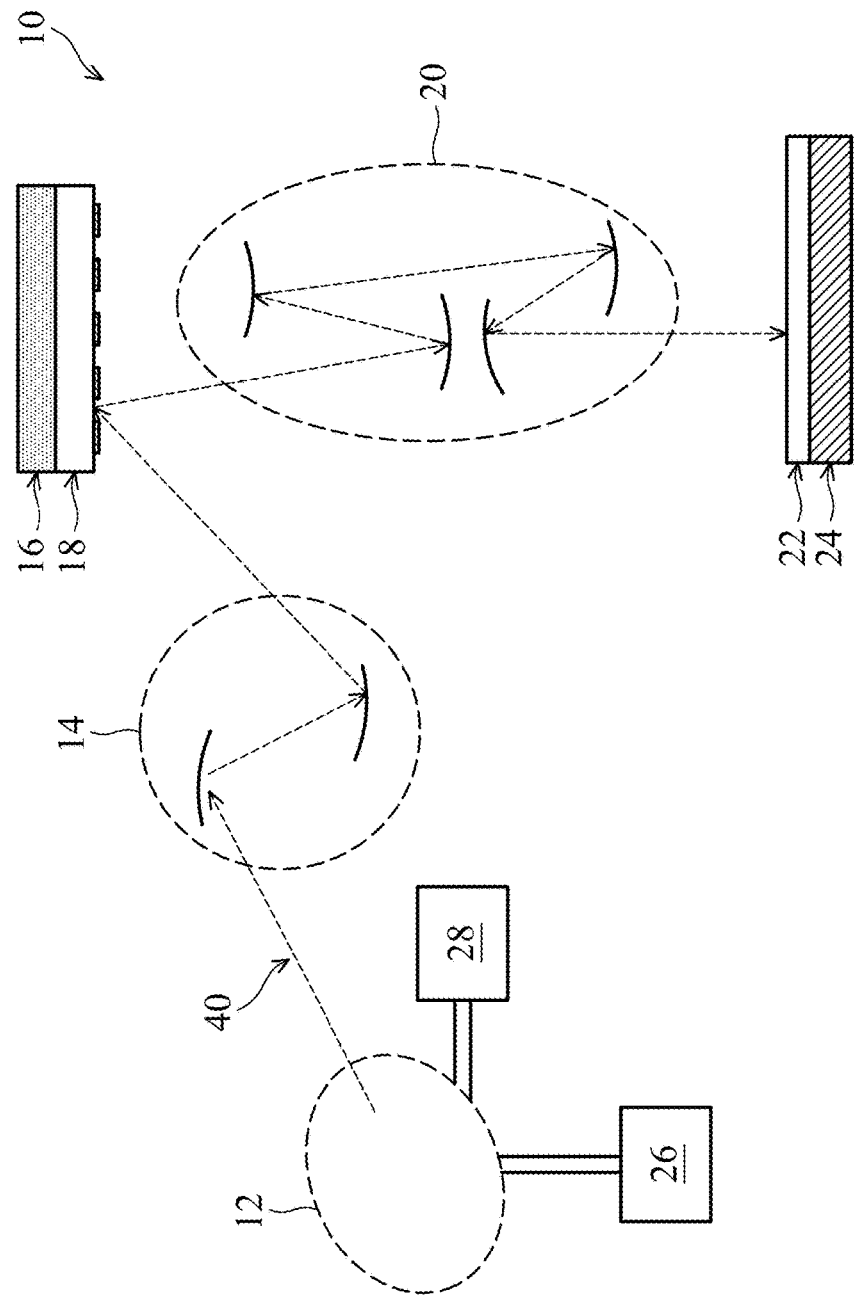
FIG. 1 is a schematic view of a EUV lithography system, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to extreme ultraviolet (EUV) lithography system and methods. More particularly, it is related to apparatus and methods for mitigating contamination on a collector in a laser produced plasma (LPP) EUV radiation source. The collector, also referred to as LPP collector or EUV collector, is an important component of the LPP EUV radiation source. It collects and reflects EUV radiation and contributes to overall EUV conversion efficiency and lithography throughput. However, LPP collector is subjected to damages and degradations due to the impact of particles, ions, radiation, and debris deposition. An object of the present disclosure is directed to reducing debris deposition onto the LPP collector, thereby increasing its usable lifetime.

FIG. 1 is a schematic view of a lithography system 10, constructed in accordance with some embodiments. The lithography system 10 may also be generically referred to as a scanner that is operable to perform lithography exposure processes. In the present embodiment, the lithography system 10 is an extreme ultraviolet (EUV) lithography system designed to expose a resist layer by EUV light (or EUV radiation). The resist layer is a material sensitive to the EUV light. The EUV lithography system 10 employs a radiation source 12 to generate EUV light 40, such as EUV light having a wavelength ranging between about 1 nm and about 100 nm. In one particular example, the EUV light 40 has a wavelength centered at about 13.5 nm. Accordingly, the radiation source 12 is also referred to as EUV radiation source 12. The EUV radiation source 12 may utilize a mechanism of laser-produced plasma (LPP) to generate the EUV radiation, which will be further described later.

The lithography system 10 also employs an illuminator 14. In some embodiments, the illuminator 14 includes various reflective optics such as a single mirror or a mirror system having multiple mirrors in order to direct the light 40 from the radiation source 12 onto a mask stage 16, particularly to a mask 18 secured on the mask stage 16.

The lithography system 10 also includes the mask stage 16 configured to secure the mask 18. In some embodiments, the mask stage 16 includes an electrostatic chuck (e-chuck) to secure the mask 18. In the present disclosure, the terms mask, photomask, and reticle are used interchangeably. In the present embodiment, the lithography system 10 is a EUV lithography system, and the mask 18 is a reflective mask. One exemplary structure of the mask 18 includes a substrate with a low thermal expansion material (LTEM). For example, the LTEM may include $TiO_2$ doped $SiO_2$, or other suitable materials with low thermal expansion. The mask 18 includes a reflective multi-layer (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light 40. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). The mask 18 may have other structures or configurations in various embodiments.

The lithography system 10 also includes a projection optics module (or projection optics box (POB)) 20 for imaging the pattern of the mask 18 on to a semiconductor substrate 22 secured on a substrate stage (or wafer stage) 24 of the lithography system 10. The POB 20 includes reflective optics in the present embodiment. The light 40 directed from the mask 18, carrying the image of the pattern defined on the mask 18, is collected by the POB 20. The illuminator 14 and the POB 20 may be collectively referred to as an optical module of the lithography system 10.

In the present embodiment, the semiconductor substrate 22 is a semiconductor wafer, such as a silicon wafer or other type of wafer to be patterned. The semiconductor substrate 22 is coated with a resist layer sensitive to the EUV light 40 in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide a gas (e.g., hydrogen gas) to the radiation source 12. The gas helps reduce contamination in the radiation source 12. In the present embodiment, the lithography system 10 further includes one or more exhaust systems 28. The exhaust system 28 is designed to extract debris out of the radiation source 12. The collaboration of the radiation source 12, the gas supply module 26, and the exhaust system 28 is further discussed below by referring to FIG. 2.

Figure 2:
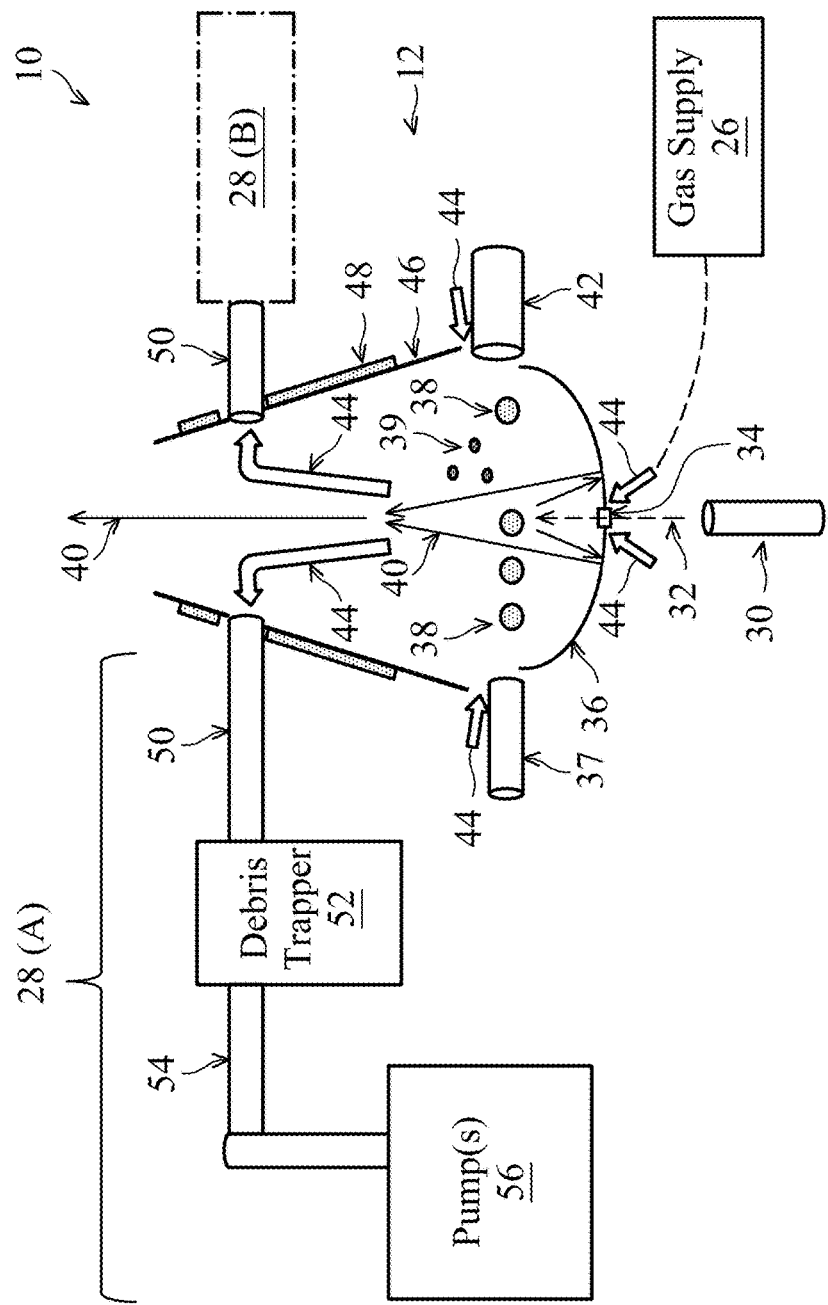
FIG. 2 is a diagrammatic view of a EUV radiation source, a gas supply module, and an exhaust system of the EUV lithography system of FIG. 1, constructed in accordance with some embodiments.

FIG. 2 illustrates a partial view of the lithography system 10, including the radiation source 12, the gas supply module 26, and two exhaust systems 28 (A) and 28 (B) in a diagrammatical view, in accordance with some embodiments. In various embodiments, the lithography system 10 may include only one exhaust system 28 or more than one exhaust system 28. Discussion below addresses the structure of one exhaust system 28 (A). However, other exhaust systems 28 can be similarly constructed.

The radiation source 12 employs a laser produced plasma (LPP) mechanism to generate plasma and further generate EUV light from the plasma. Referring to FIG. 2, the radiation source 12 includes a laser source 30, a target droplet generator 37, and a LPP collector 36. The target droplet generator 37 generates a plurality of target droplets 38. In an embodiment, the target droplets 38 are tin (Sn) droplets. In some examples, the tin droplets 38 each may have a diameter about 30 microns (μm) and are generated at a rate about 50 kilohertz (kHz). The tin droplets 38 are introduced into a zone of excitation in the radiation source 12 at a speed about 70 meters per second (m/s) in one example. Other material may also be used for the target droplets 38, for example, a tin-containing liquid material such as eutectic alloy containing tin, lithium (Li), and xenon (Xe).

The laser source 30 may include a carbon dioxide ($CO_2$) laser source, a neodymium-doped yttrium aluminum garnet (Nd:YAG) laser source, or other suitable laser source to generate a laser beam 32. The laser beam 32 is directed through an output window 34 integrated with the collector 36. The output window 34 adopts a suitable material substantially transparent to the laser beam 32. The laser beam 32 is directed to heat the target droplets 38, such as tin droplets, thereby generating high-temperature plasma, which further produces the EUV light 40. The pulses of the laser source 30 and the droplet generating rate of the droplet generator 37 are controlled to be synchronized such that the target droplets 38 receive peak powers consistently from the laser pulses of the laser source 30. In some embodiments, the radiation source 12 may employ a dual LPP mechanism where the laser source 30 is a cluster of multiple laser sources. For example, the laser source 30 may include a pre-heat laser source and a main laser source, which produce pre-heat laser beam and main laser beam, respectively. Each of the pre-heat laser source and the main laser source may be a $CO_2$ laser source, an Nd:YAG laser source, or other suitable laser source. The pre-heat laser beam has a smaller spot size and less intensity than the main laser beam, and is used for pre-heating the target droplet 38 to create a low-density target plume, which is subsequently reheated by the main laser beam, generating increased emission of EUV light 40. The EUV light 40 is collected by the collector 36. The collector 36 further reflects and focuses the EUV light 40 for the lithography exposure processes.

The collector 36 is designed with proper coating material and shape, functioning as a mirror for EUV collection, reflection, and focus. In some examples, the collector 36 is designed to have an ellipsoidal geometry. In some examples, the coating material of the collector 36 is similar to the reflective multilayer of the EUV mask 18. In some examples, the coating material of the collector 36 includes a ML (such as a plurality of Mo/Si film pairs) and may further include a capping layer (such as Ru) coated on the ML to substantially reflect the EUV light. In some examples, the collector 36 may further include a grating structure designed to effectively scatter the laser beam directed onto the collector 36. For example, a silicon nitride layer may be coated on the collector 36 and patterned to have a grating structure.

The radiation source 12 may include other components. For example, it may include a central obscuration (not shown) designed and configured to obscure the laser beam 32; and it may include an intermediate focus (IF)-cap module (not shown) configured to provide intermediate focus to the EUV radiation 40. The radiation source 12 is configured in an enclosed space (referred to as a source vessel). The source vessel is maintained in a vacuum environment since the air absorbs the EUV radiation.

In some embodiments, the laser beam 32 may or may not hit every target droplet 38. For example, some target droplets 38 may be purposely missed by the laser beam 32. In the present embodiment, the radiation source 12 includes a droplet catcher 42, which is installed opposite the target droplet generator 37 and in the direction of the movement of the target droplets 38. The droplet catcher 42 is configured to catch any target droplets that are missed by the laser beam 32. Further, the high-temperature plasma may cool down and become vapors or small particles (collectively, debris) 39. The debris 39 may deposit onto the surface of the collector 36, thereby causing contamination thereon. Over time, the reflectivity of the collector 36 degrades due to debris accumulation and other factors such as ion damages, oxidation, and blistering. Once the reflectivity is degraded to a certain degree, the collector 36 reaches the end of its usable lifetime and may need to be swapped out. The present disclosure provides mechanisms for reducing contamination on the surface of the collector 36, thereby extending its usable lifetime. One mechanism for reducing the aforementioned contamination according to the present disclosure is to integrate a gas flow mechanism with the collector 36. In the present embodiment, the gas flow mechanism includes the gas supply module 26, the exhaust system 28, and various pipelines for integrating the gas flow mechanism with the collector 36.

Still referring to FIG. 2, the lithography system 10 further includes the gas supply module 26. The gas supply module 26 is configured to provide a gas 44 into the source vessel and particularly into a space proximate the reflective surface of the collector 36. In an embodiment, the gas 44 is hydrogen gas, which has less absorption to the EUV radiation. When the target droplets 38 contain tin, hydrogen gas 44 reaching to the coating surface of the collector 36 (and the window 34 as well) reacts chemically with tin to form stannane ($SnH_4$), a gaseous byproduct of the EUV generation process itself. Pumped out (e.g., by the exhaust system 28), stannane is then discarded. Other suitable gas may be alternatively or additionally used. The gas 44 may be introduced into the collector 36 through openings (or gaps) near the window 34 through one or more gas pipelines. In the following discussion, the debris 39 includes such byproducts between the residues of the target droplets 38 and the gas 44.

The lithography system 10 further includes a cover 46 integrated with the collector 36. Part of the function of the cover 46 is for ventilation and for collecting debris 39. In some embodiments, the cover 46 is made of a suitable solid material, such as stainless steel. The cover 46 is designed and configured around the collector 36 with certain gap between them in the present embodiment. The gap also functions as a gas flow path for providing the gas 44 into the collector 36 and the cover 46. In some embodiments (as shown in FIG. 2), the lithography system 10 further includes a heating unit 48 configured around part of the cover 46. The heating unit 48 functions to maintain the temperature inside the cover 46 above a melting point of the debris 39 so that the debris 39 does not solidify on the inner surface of the cover 46. The inner surface of the cover 46 may be designed for capturing debris, which will be discussed later in conjunction with FIG. 3A.

As illustrated in FIG. 2, in addition to the potential chemical effects as discussed above, the gas 44 also functions to carry the debris 39 out of the collector 36 and the cover 46 and into the exhaust system 28. At this point, the gas 44 and the debris 39 may be collectively referred to as the exhaust of the radiation source 12. The exhaust system 28 includes one or more exhaust lines 50 and 54, a debris trapping device (or debris trapper) 52, and one or more pumps 56. The exhaust line 50 is connected to the cover 46 for receiving the exhaust. In the present embodiment, the cover 46 is designed to have a cone shape with its wide base integrated with the collector 36 and its narrow top section facing the illuminator 14 (FIG. 1). To further this embodiment, the exhaust line 50 is connected to the cover 46 at its top section, and the heating unit 48 is also configured around the top section of the cover 46. In another embodiment, the exhaust line 50 is connected to the cover 46 at its very end of the top section (not shown). As will be explained later, the inner surface of the cover 46 may be designed to catch some of the debris 39. Installing the exhaust line 50 at the top section of the cover 46 helps get the remaining portion of the debris 39 out of the space defined by the collector 36 and the cover 46. The exhaust line 50 receives the debris 39 in the form of vapors or is that we will mail is a small particles along with the gas 44.

The debris trapper 52 is connected to the exhaust line 50 and is configured to receive and trap the debris 39 (or debris vapor 39). For example, the debris trapper 52 may include certain structure(s), such as labyrinth structures, nano rods, and porous macrostructures. When the debris vapor 39 hits the structure, it condenses into liquid or solid form, thereby being "trapped" inside the debris trapper 52. The exhaust line 54 is connected to the debris trapper 52, opposite the exhaust line 50 with respect to the direction of exhaust flow. Another end of the exhaust line 54 is connected to the pump 56 which is a vacuum pump such as a vacuum pump made by Edwards Vacuum LLC. The pump 56 creates airflow from the cover 46 into the exhaust line 50 and the debris trapper 52, effectively pumping out the debris 39. Without the debris trapper 52, the debris 39 would be sucked into the pump 56 and cause damages thereto. Some approaches install a filter or a scrubber at the entrance of the exhaust line 50 (viewed from the gas flow 44). The filter or the scrubber functions to stop the debris 39 from getting into the exhaust line 50. One issue with such approaches is that the filter or the scrubber can be easily clogged by the debris 39, diminishing the effectiveness of the exhaust system 28. Another issue is that replacing the clogged filter or scrubber can be time-consuming because it is installed inside the cover 46. In the present disclosure, the debris trapper 52 overcomes these issues. In an embodiment, the debris trapper 52 is detachably attached to the exhaust lines 50 and 54. After certain use, the debris trapper 52 may be replaced with a clean one, which is an easier task than replacing a filter inside the cover 46.

Figure 3A:
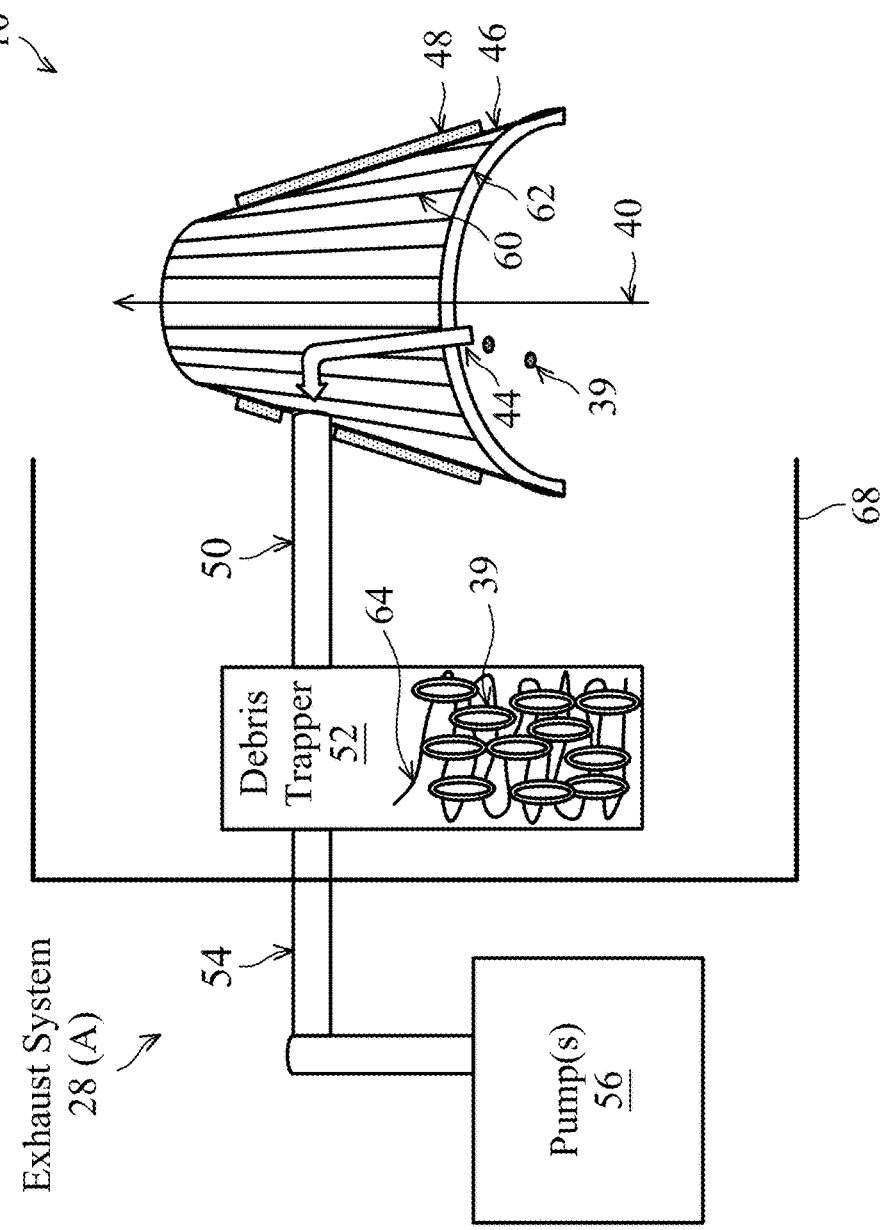
FIGS. 3A, 4, and 5 are diagrammatic and partial cross-sectional views of parts of the EUV lithography system of FIG. 1, constructed in accordance with some embodiments.

FIG. 3A illustrates a fragmentary view of a portion of the lithography system 10 including the exhaust system 28 and the cover 46. Referring to FIG. 3A, in an embodiment, the inner surface of the cover 46 comprises a plurality of vanes 60. The vanes 60 may be evenly spaced around the cone-shaped cover 46. Further, the heating unit 48 functions to maintain the temperature of the cover 46 including the vanes 60 above the melting point of the material included in the debris 39. When the debris vapor 39 comes in contact with the vanes 60, it may condense into a liquid form and flow into a lower section 62 of the cover 46. The lower section 62 may provide holes (not shown) for draining the debris liquid out of the cover 46.

Figure 3C:
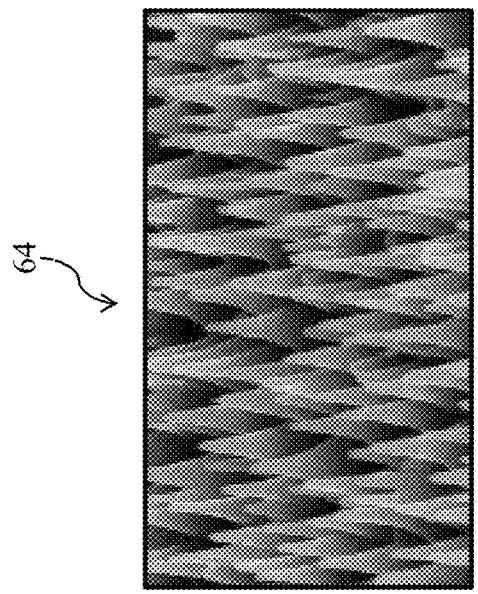
Figure 3B:
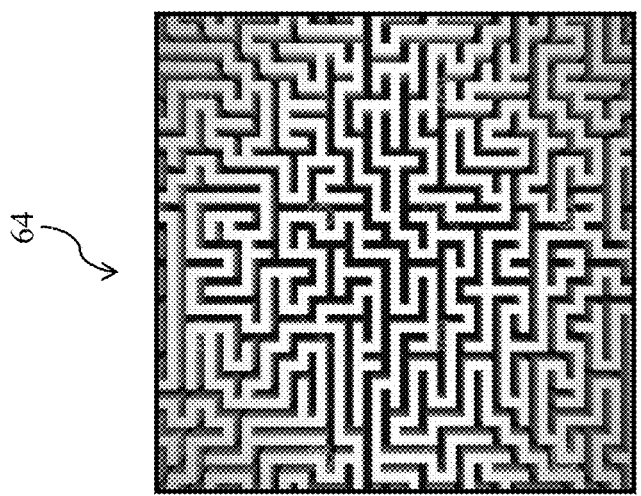

However, not all the debris vapor 39 is caught by the vanes 60. A portion of the debris vapor 39 is directed into the debris trapper 52 through the exhaust line 50. In the present embodiment, the exhaust line 50 operates (or is maintained) at a temperature higher than a melting point of the material included in the debris vapor 39. This ensures that the debris vapor 39 flows freely into the debris trapper 52 through the exhaust line 50. For example, if the debris vapor 39 is mostly tin, the exhaust line 50 may operate at a temperature higher than 232° C. (tin's melting point is 231.9° C.). In an embodiment, the exhaust line 50 may be wrapped around by a heating unit (not shown in FIG. 3A, but shown in FIG. 4) which provides the desired operating temperature. In another embodiment, the exhaust line 50 is placed in a temperature-controlled room 68 together with the cover 46. The temperature-controlled room 68 is provided with the desired operating temperature. To further this embodiment, the debris trapper 52 is also placed in the temperature-controlled room 68. In the present embodiment, the debris trapper 52 includes a debris trapping structure 64 having a cooling surface. As illustrated in FIG. 3A, the debris vapor 39 condenses into liquid or solid form on the surface of the structure 64. In an embodiment, the structure 64 includes a labyrinth path structure, an example of which is shown in FIG. 3B. In another embodiment, the structure 64 includes nano rods (or nanometer-sized cones), an example of which is shown in FIG. 3C. In yet another embodiment, the structure 64 includes porous macrostructures, two examples of which are shown in FIG. 3D.

The exhaust line 54 (or a majority thereof) operates at a temperature lower than the melting point of the material included in the debris vapor 39. So does the pump 56. For example, the pump 56 and the exhaust line 54 may operate at room temperature, such as from 18 to 24° C.

In an embodiment, the debris trapper 52 can be detached from the exhaust lines 50 and 54. After certain usage, the debris trapper 52 may be replaced with a clean one. The debris trapper 52 may include a usage indicator for this purpose. In another embodiment, the debris trapper 52 includes a housing and a cartridge installed in the housing. The housing is made of a material suitable for operating at the temperature discussed above. For example, the housing may be made of steel, ceramic, or other suitable material. The housing may be fixedly or detachably connected to the exhaust lines 50 and 54. The cartridge contains certain structures such as the labyrinth path structure 64 for trapping the debris vapor 39. The cartridge may be replaced without disconnecting the housing from the exhaust lines 50 and 54. Various other embodiments of the debris trapper 52 are possible. Two of them are shown in FIGS. 4 and 5.

Figure 4:
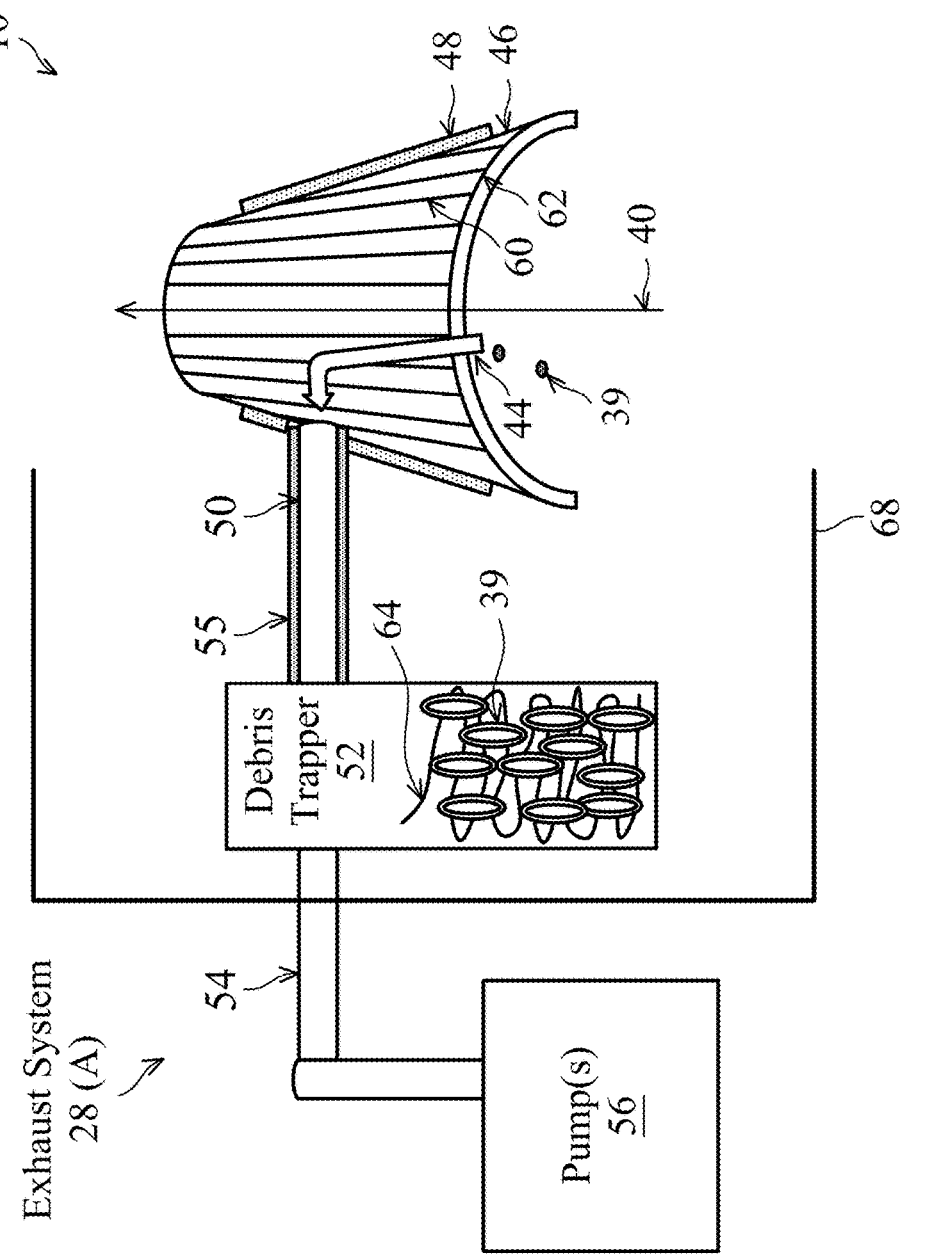
Figure 5:
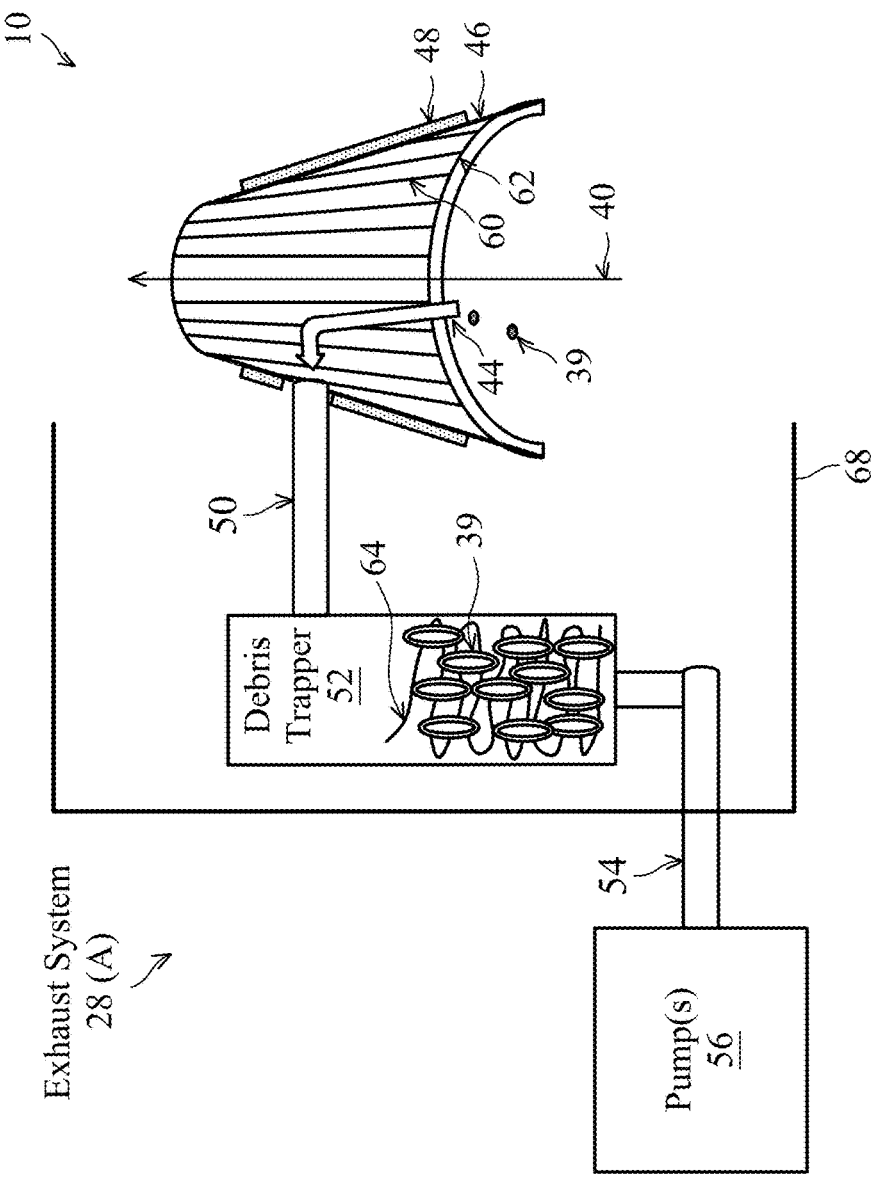

Referring to FIG. 4, in another embodiment, the lithography system 10 further includes a heating unit 55 wrapping around at least a portion of the exhaust line 50 to ensure that the exhaust line 50 operates at a temperature higher than a melting point of the debris vapor 39 and that the debris vapor 39 flows freely into the debris trapper 52 through the exhaust line 50. Referring to FIG. 5, in another embodiment, the exhaust lines 50 and 54 are configured such that the debris trapping structure 64 is on an exhaust flow path from the exhaust line 50 to the exhaust line 54. As the debris vapor 39 flows through the debris trapping structure 64, it condenses into liquid or solid form. In various embodiments, although not shown, the debris trapper 52 may also be wrapped around by a cooling mechanism to increase its effectiveness.

Figure 6:
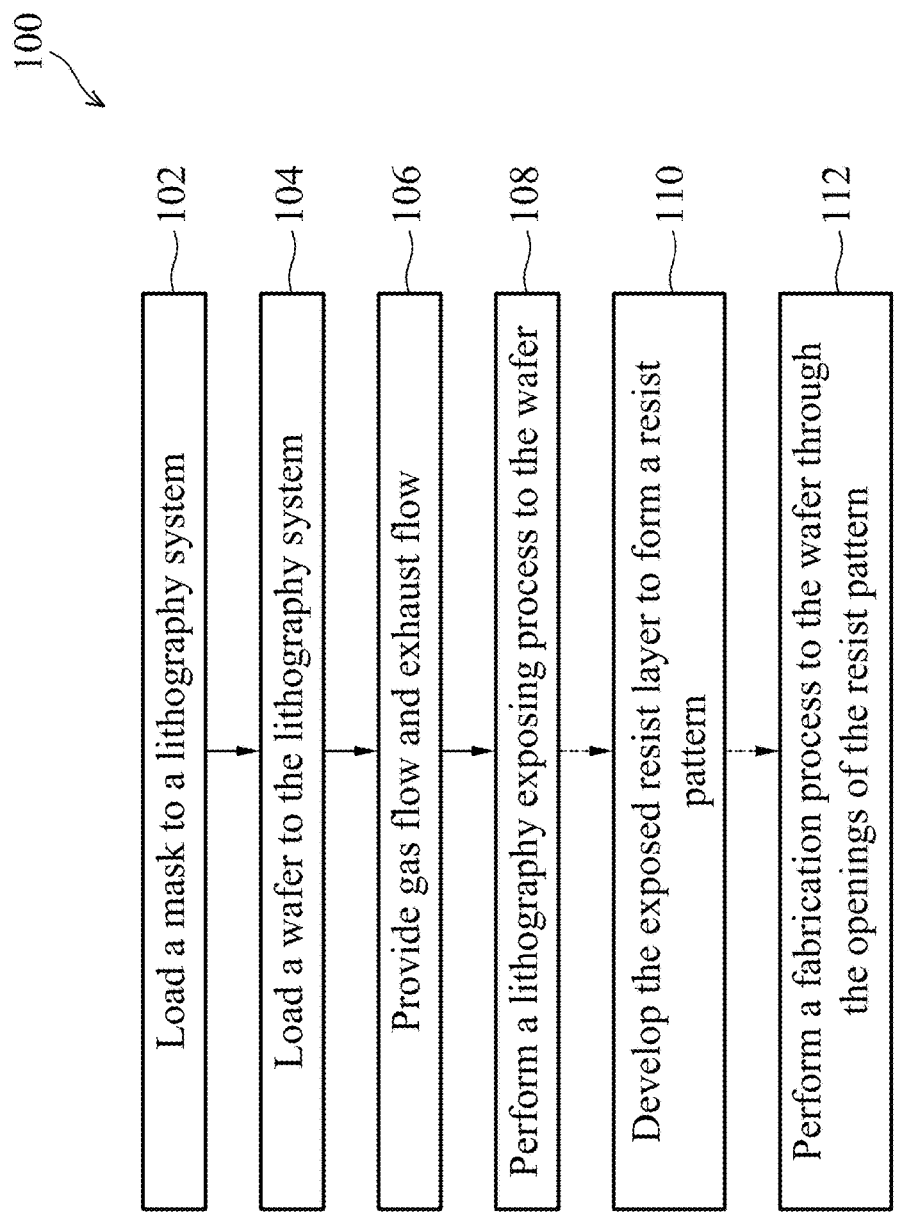
FIG. 6 is a flowchart of a lithography process constructed in accordance with some embodiments.

FIG. 6 is a flowchart of a method 100 for an EUV lithography process implemented by the EUV lithography system 10, constructed in accordance with some embodiments. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims.

The method 100 includes an operation 102 which loads a EUV mask, such as the mask 18 to the lithography system 10 that is operable to perform a EUV lithography exposure process. The mask 18 includes an IC pattern to be transferred to a semiconductor substrate, such as the wafer 22. The operation 102 may further include various steps, such as securing the mask 18 on the mask stage 16 and performing an alignment.

The method 100 includes an operation 104 which loads the wafer 22 to the lithography system 10, particularly on the wafer stage 24. The wafer 22 is coated with a resist layer. In the present embodiment, the resist layer is sensitive to the EUV radiation 40 from the radiation source 12 of the lithography system 10.

The method 100 includes an operation 106 by providing a gas 44 (e.g., hydrogen gas) to the source vessel that includes the radiation source 12, as a protective layer to the coating surface of the collector 36, and further providing an exhaust flow out of the source vessel. Particularly, the operation 106 includes operating the pump 56 to extract debris 39 and other contaminants out of the source vessel through the first pipeline 50, the debris trapper 52, and the second pipeline 54. Further, the operation 106 includes operating the first pipeline 50 and the debris trapper 52 at a temperature higher than the melting point of the debris 39 (e.g., tin) and operating the second pipeline 54 and the pump 56 at a temperature lower than the melting point of the debris 39, such as at room temperature. The gas flow and the exhaust flow collectively reduce contamination on the surface of the collector 36. The operation 106 may monitor the usage of the debris trapper 52 and replace it as needed.

The method 100 includes an operation 108 by performing a lithography exposure process to the wafer 22 in the lithography system 10. In the operation 108, the target droplet generator 37 and the laser source 30 are operated synchronously to heat up the target droplets 38, thereby generating EUV light 40. At the same time, the debris 39 (e.g., tin debris) may spread out and/or react with the gas 44. Some of the debris 39 may be caught by the inner surface of the cover 46 and drained out accordingly. Some of the debris 39 is extracted out of the source vessel and trapped in the debris trapper 52.

During the operation 108, the EUV light 44 is illuminated on the mask 18 (by the illuminator 14), and is further projected on the resist layer coated on the wafer 22 (by the POB 20), thereby forming a latent image on the resist layer. In some embodiments, the lithography exposing process is implemented in a scan mode.

The method 100 may include other operations to complete the lithography process. For example, the method 100 may include an operation 110 by developing the exposed resist layer to form a resist pattern having a plurality of openings defined thereon. Particularly, after the lithography exposure process at the operation 108, the wafer 22 is transferred out of the lithography system 10 to a developing unit to perform a developing process to the resist layer. The method 100 may further include other operations, such as various baking steps. As one example, the method 100 may include a post-exposure baking (PEB) step between the operations 108 and 110.

The method 100 may further include other operations, such as an operation 112 to perform a fabrication process to the wafer 22 through the openings of the resist pattern. In one example, the fabrication process includes an etch process to the wafer 22 using the resist pattern as an etch mask. In another example, the fabrication process includes an ion implantation process to the wafer 22 using the resist pattern as an implantation mask.

Although not intended to be limiting, one or more embodiments of the present disclosure provide many benefits to the manufacturing of semiconductor devices. For example, embodiments of the present disclosure provide apparatus and methods for effectively reducing contamination on LLP collectors as well as on vacuum pumps. The apparatus and methods provided herein enable convenient and quick maintenance of the lithography system, thereby reducing the downtime of the lithography system and increasing the throughput thereof. Embodiments of the present disclosure can be implemented or integrated into existing EUV lithography systems.

In one exemplary aspect, the present disclosure is directed to a EUV lithography system. The EUV lithography system includes a collector designed to collect and reflect EUV radiation, a cover integrated with the collector, a first exhaust line connected to the cover and configured to receive debris vapor from the collector, a debris trapper connected to the first exhaust line and configured to trap the debris vapor, and a second exhaust line connected to the debris trapper.

In another exemplary aspect, the present disclosure is directed to a EUV lithography system. The EUV lithography system includes a collector designed to collect and reflect EUV radiation; a cover integrated with the collector; a first exhaust line connected to the cover and configured to receive debris vapor from the cover, the debris vapor comprising tin; a debris trapper connected to the first exhaust line and configured to receive the debris vapor and to convert the debris vapor to a liquid or solid; a second exhaust line connected to the debris trapper; and a pump connected to the second exhaust line and configured to extract the debris vapor out of the cover and into the first exhaust line.

In another exemplary aspect, the present disclosure is directed to a EUV lithography system. The EUV lithography system includes a collector designed to collect and reflect EUV radiation; a cover integrated with the collector; a gas supply module integrated with the collector and configured to supply a gas into the collector and the cover; a first exhaust line connected to the cover; a debris trapper connected to the first exhaust line; a second exhaust line connected to the debris trapper; and a pump connected to the second exhaust line for extracting exhaust out of the collector and the cover, wherein the exhaust carries vapors of a debris and the debris trapper is configured to catch the vapors of the debris.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) lithography system, comprising:
    a collector designed to collect and reflect EUV radiation;
    a cover integrated with the collector;
    a first exhaust line connected to the cover and configured to receive debris vapor from the collector;
    a debris trapper connected to the first exhaust line and configured to trap the debris vapor; and
    a second exhaust line connected to the debris trapper.

2. The EUV lithography system of claim 1, wherein the first exhaust line is configured to operate at a first temperature higher than a melting point of a material included in the debris vapor, and the second exhaust line is configured to operate at a second temperature lower than the melting point of the material included in the debris vapor.

3. The EUV lithography system of claim 1, wherein the debris vapor includes tin.

4. The EUV lithography system of claim 1, wherein the debris trapper includes a labyrinth path structure having a cooling surface.

5. The EUV lithography system of claim 1, wherein the debris trapper is detachably attached to the first and second exhaust lines.

6. The EUV lithography system of claim 1, wherein the debris trapper includes nano rods or porous macro structures.

7. The EUV lithography system of claim 1, further comprising:
    a pump connected to the second exhaust line for extracting the debris vapor out of the cover.

8. The EUV lithography system of claim 7, further comprising:
    a gas supply module for supplying a gas into the collector.

9. The EUV lithography system of claim 1, wherein the debris trapper has a housing that comprises steel.

10. The EUV lithography system of claim 9, wherein the debris trapper further includes a replaceable cartridge installed in the housing.

11. An extreme ultraviolet (EUV) lithography system, comprising:
    a collector designed to collect and reflect EUV radiation;
    a cover integrated with the collector;
    a first exhaust line connected to the cover and configured to receive debris vapor from the cover, the debris vapor comprising tin;
    a debris trapper connected to the first exhaust line and configured to receive the debris vapor and to convert the debris vapor to a liquid or solid;
    a second exhaust line connected to the debris trapper; and
    a pump connected to the second exhaust line and configured to extract the debris vapor out of the cover and into the first exhaust line.

12. The EUV lithography system of claim 11, wherein the debris trapper is detachably attached to the first and second exhaust lines.

13. The EUV lithography system of claim 11, wherein the first exhaust line is configured to operate at a first temperature higher than a melting point of tin, and the second exhaust line and the pump are configured to operate at room temperature.

14. The EUV lithography system of claim 11, wherein the debris trapper includes a labyrinth path structure with a cooling surface.

15. The EUV lithography system of claim 11, wherein the debris trapper includes nano rods or porous macro structures.

16. The EUV lithography system of claim 11, wherein the debris trapper includes a housing and a replaceable cartridge installed in the housing.

17. An extreme ultraviolet (EUV) lithography system, comprising:
    a collector designed to collect and reflect EUV radiation;
    a cover integrated with the collector;
    a gas supply module integrated with the collector and configured to supply a gas into the collector and the cover;
    a first exhaust line connected to the cover;
    a debris trapper connected to the first exhaust line;
    a second exhaust line connected to the debris trapper; and a pump connected to the second exhaust line for extracting exhaust out of the collector and the cover, wherein the exhaust carries vapors of a debris and the debris trapper is configured to catch the vapors of the debris.

18. The EUV lithography system of claim 17, wherein the debris trapper includes a labyrinth path structure having a cooling surface.

19. The EUV lithography system of claim 18, wherein the labyrinth path structure is in a replaceable cartridge, and the debris trapper includes a housing for receiving the replaceable cartridge.

20. The EUV lithography system of claim 17, further comprising a heating unit wrapping around a portion of the cover where the first exhaust line is connected to the cover.

\* \* \* \* \*